US012635551B2

(12) United States Patent
Tseng et al.

(10) Patent No.: US 12,635,551 B2
(45) Date of Patent: May 19, 2026

(54) CHIP PACKAGE STRUCTURE

(71) Applicant: TONG HSING ELECTRONIC INDUSTRIES, LTD., Taipei City (TW)

(72) Inventors: Yu-Chiao Tseng, Taipei City (TW); Chia-Min Wu, Taipei City (TW); Yi-Ta Lai, Taipei City (TW); Cheng-Yuan Wang, Taipei City (TW); Szu-Yao Huang, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 353 days.

(21) Appl. No.: 18/448,961

(22) Filed: Aug. 13, 2023

(65) Prior Publication Data

US 2024/0321810 A1      Sep. 26, 2024

(30) Foreign Application Priority Data

Mar. 23, 2023    (TW) .................................. 112110809

(51) Int. Cl.
| | |
|---|---|
| *H10W 72/30* | (2026.01) |
| *H10W 72/50* | (2026.01) |
| *H10W 72/00* | (2026.01) |
| *H10W 74/00* | (2026.01) |
| *H10W 76/60* | (2026.01) |

(Continued)

(52) U.S. Cl.
CPC ........... *H10W 72/30* (2026.01); *H10W 72/50* (2026.01); *H10W 72/07352* (2026.01); *H10W 72/07353* (2026.01); *H10W 72/07354* (2026.01); *H10W 72/07355* (2026.01); *H10W*

*72/07554* (2026.01); *H10W 72/327* (2026.01); *H10W 72/337* (2026.01); *H10W 72/348* (2026.01); *H10W 72/357* (2026.01); *H10W 74/00* (2026.01); *H10W 76/60* (2026.01); *H10W 76/67* (2026.01);

(Continued)

(58) Field of Classification Search
CPC ......... H01L 24/33; H01L 24/32; H01L 24/48; H01L 2224/32225; H01L 2224/3303; H01L 2224/3305; H01L 2224/33135; H01L 2224/33505; H01L 2224/48105; H01L 2224/48227; H01L 2924/16235; H01L 2924/1631; H01L 2924/16588; H01L 2924/182
See application file for complete search history.

(56) References Cited

U.S. PATENT DOCUMENTS

| | | | |
|---|---|---|---|
| 8,269,300 | B2 | 9/2012 | Chien et al. |
| 9,419,033 | B2 | 8/2016 | Hsu et al. |

(Continued)

*Primary Examiner* — Elias Ullah
(74) *Attorney, Agent, or Firm* — Li & Cai Intellectual Property Office

(57) ABSTRACT

A chip package structure includes a substrate, a chip, a light-permeable element, and an adhesive element. The chip is disposed on the substrate. The light-permeable element is disposed above the chip. The adhesive element is connected between the chip and the light-permeable element. The adhesive element surrounds the chip for formation of an accommodating space, and the chip is located in the accommodating space. The adhesive element includes two material layers having complementary visible light absorption spectra, such that the adhesive element is capable of being used to absorb full visible spectrum light.

10 Claims, 8 Drawing Sheets

(51) Int. Cl.
    *H10W 76/67*        (2026.01)
    *H10W 90/00*        (2026.01)

(52) U.S. Cl.
    CPC ........ *H10W 90/734* (2026.01); *H10W 90/754* (2026.01)

(56) References Cited

U.S. PATENT DOCUMENTS

| | | |
|---|---|---|
| 10,048,118 B2 | 8/2018 | Park et al. |
| 11,393,859 B2 | 7/2022 | Jo et al. |
| 2009/0267170 A1* | 10/2009 | Chien .................. H10F 39/011 |
| | | 257/434 |
| 2019/0305024 A1 | 10/2019 | Chiu et al. |
| 2021/0305437 A1 | 9/2021 | Liu et al. |
| 2021/0391368 A1 | 12/2021 | Tresnado et al. |

* cited by examiner

CHIP PACKAGE STRUCTURE

CROSS-REFERENCE TO RELATED PATENT APPLICATION

This application claims the benefit of priority to Taiwan Patent Application No. 112110809, filed on Mar. 23, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package structure, and more particularly to a chip package structure capable of reducing stray light that enters an image sensing region.

BACKGROUND OF THE DISCLOSURE

In an existing image sensor, when external light (such as visible light) enters the image sensor to form an image, the light passes through a lens before entering the image sensor. Then, most of the light will be received by an image sensing region of a chip. A small portion of the light is incident to surrounding structures of the image sensor (such as an edge of an encapsulation compound or a substrate), and is reflected once or more than once before entering the image sensing region. This small portion of the light is referred to as stray light. The stray light may cause flare and affect the image quality.

Therefore, how to design a chip package structure capable of reducing the probability of the stray light entering the image sensing region has become an important issue in the related art.

SUMMARY OF THE DISCLOSURE

In response to the above-referenced technical inadequacy, the present disclosure provides a chip package structure, which can address an issue of an image quality of an existing image sensor being easily affected by stray light.

In order to solve the above-mentioned problem, one of the technical aspects adopted by the present disclosure is to provide a chip package structure, which includes a substrate, a chip, a light-permeable element, and an adhesive element. The chip is disposed on the substrate. The light-permeable element is disposed above the chip. The adhesive element is connected between the chip and the light-permeable element. The adhesive element surrounds the chip for formation of an accommodating space, and the chip is located at the accommodating space. The adhesive element includes two material layers having complementary visible light absorption spectra, such that the adhesive element is capable of being used to absorb full visible spectrum light.

Therefore, in the chip package structure provided by the present disclosure, through the structural feature of the adhesive element including two material layers and the optical property of the two material layers having complementary visible light absorption spectra, the adhesive element can be used to absorb the full visible spectrum light. Accordingly, the adhesive element can directly absorb the stray light that is incident into the chip package structure, so as to reduce the probability of reflection to the image sensing region and improve the image quality.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
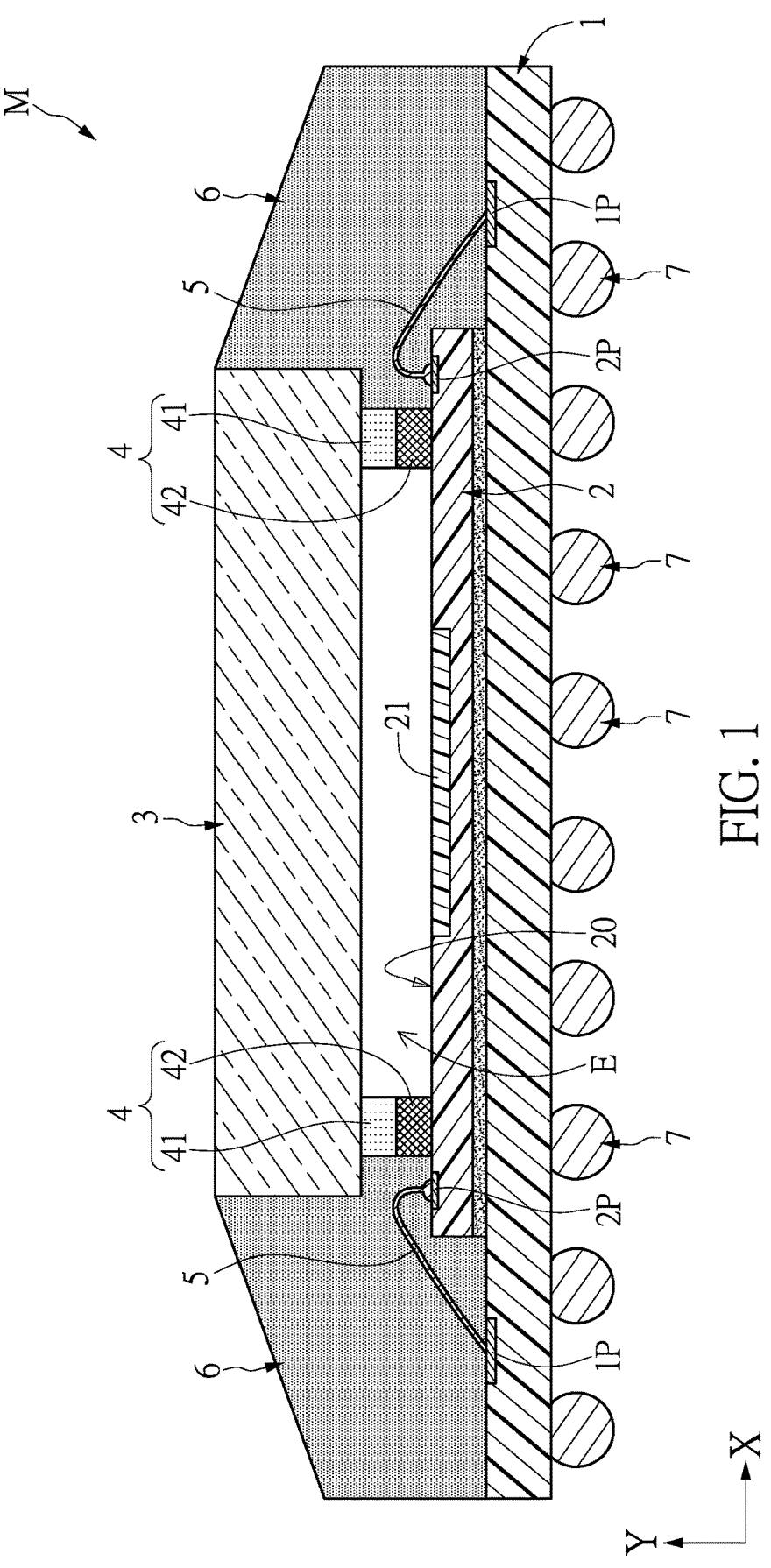
FIG. 1 is a schematic cross-sectional view of a chip package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic cross-sectional view of a chip package structure according to a first embodiment of the present disclosure. A first embodiment of the present disclosure provides a chip package structure M, which includes a substrate 1, a chip 2, a light-permeable element 3, and an adhesive element 4. The chip 2 is disposed on the substrate 1. The light-permeable element 3 is disposed above the chip 2. The adhesive element 4 is connected between the chip 2 and the light-permeable element 3, and the chip 2 and the light-permeable element 3 are separated from each other. For example, the substrate 1 is formed of a ceramic, and the light-permeable element 3 is formed of a transparent glass. However, the present disclosure is not limited thereto. Furthermore, the adhesive element 4 surrounds the chip 2 for formation of an accommodating space E, and the chip 2 is located at the accommodating space E. A plurality of solder balls 7 can be disposed on a bottom surface of the substrate 1. The chip package structure M can be soldered and fixed onto an electronic component (not shown in the figures) through the plurality of solder balls 7, such that the chip package structure M is electrically coupled to the electronic component.

For example, the chip 2 may be an image sensing die (e.g., a complementary metal oxide semiconductor (CMOS) sensing die), and an upper surface 20 of the chip 2 has an image sensing region 21. External light (such as visible light) can pass through the light-permeable element 3, and is received by the image sensing region 21 of the chip 2 to form an image. However, the present disclosure is not limited thereto. In addition, the chip package structure M further includes a plurality of metal wires 5 electrically connected between the chip 2 and the substrate 1. More specifically, one end of each of the metal wires 5 is connected to a conducting portion 2P of the chip 2, and another end of each of the metal wires 5 is connected to a pad 1P of the substrate 1. Therefore, the substrate 1 can be electrically coupled to the chip 2 through the plurality of metal wires 5. Here, any of the metal wires 5 can be formed by normal bonding or reverse bonding, but the present disclosure is not limited thereto.

The chip package structure M can further include an encapsulation compound 6. The encapsulation compound 6 is disposed on the substrate 1. The chip 2, the adhesive element 4, the plurality of metal wires 5, and a part of the light-permeable element 3 are embedded within the encapsulation compound 6, and an outer surface of the light-permeable element 3 that faces outward is exposed from the encapsulation compound 6. The encapsulation compound 6 can be, for example, a liquid compound or a molding compound, but the present disclosure is not limited thereto.

In addition, the adhesive element 4 includes two different material layers, and the two material layers are stacked up and down. The material of the two material layers is not limited in the present disclosure. Moreover, the two material layers have complementary visible light absorption spectra, such that the adhesive element 4 is capable of being used to absorb full visible spectrum light ranging from 380 nm to 750 nm.

As shown in FIG. 1, in the present disclosure, the two material layers that are stacked up and down can be divided into a first material layer 41 and a second material layer 42, and the first material layer 41 is stacked above the second material layer 42. In another embodiment, the second material layer 42 can be stacked above the first material layer 41. The present disclosure is not limited thereto.

It should be noted that ranges of the light absorption spectra of the first material layer 41 and the second material layer 42 are not limited in the present disclosure. For example, the first material layer 41 can absorb visible light having a wavelength from 300 nm to 600 nm. Alternatively, the reflectance of the first material layer 41 for the visible light having a wavelength from 300 nm to 600 nm is less than 10%. The second material layer 42 can absorb visible light having a wavelength from 600 nm to 1,200 nm. Alternatively, the reflectance of the second material layer 42 for the visible light having a wavelength from 600 nm to 1,200 nm is less than 10%. Therefore, the adhesive element 4 is capable of absorbing the full visible spectrum of light ranging from 380 nm to 750 nm. In other words, any two material layers that have the complementary visible light absorption spectra and cover the full visible spectrum of light are within the scope of the present disclosure.

Figure 2:
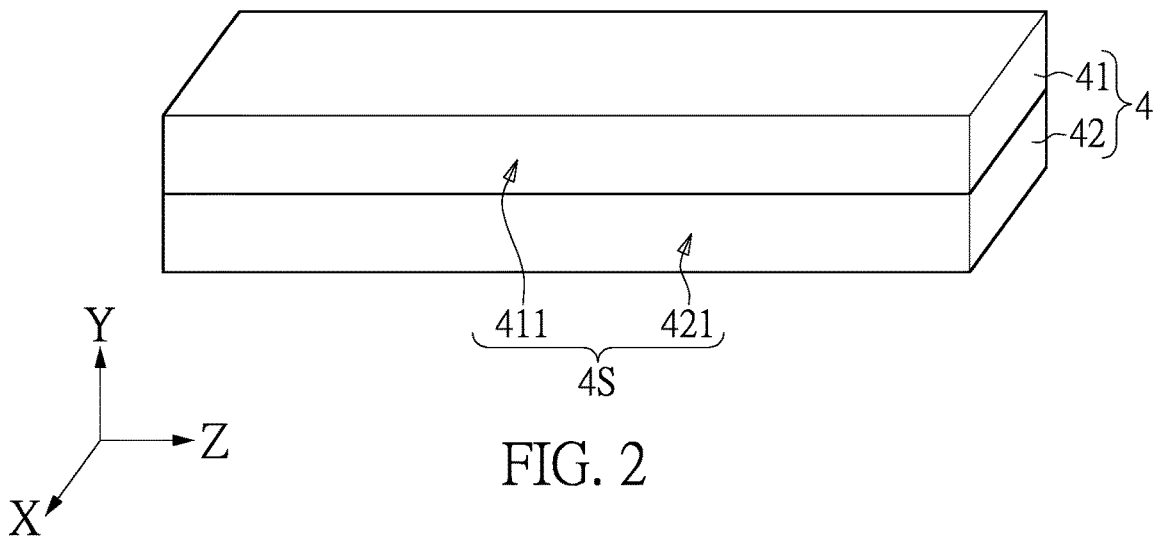
FIG. 2 is a schematic view of an adhesive element according to the first embodiment of the present disclosure.
Figure 3:
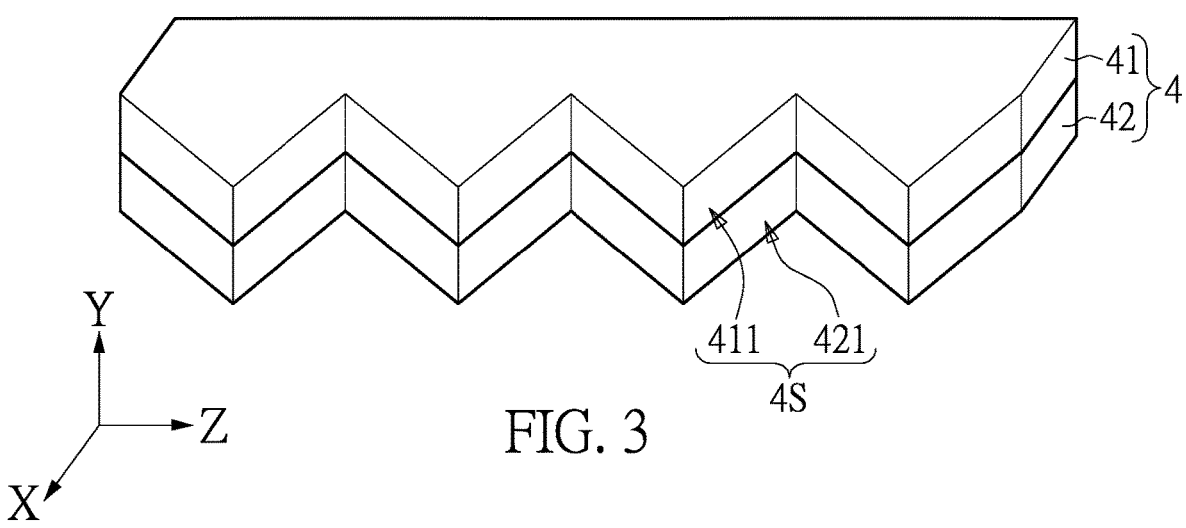
FIG. 3 is another schematic view of the adhesive element according to the first embodiment of the present disclosure.

Reference is made to FIG. 2 and FIG. 3, which show different configurations of the adhesive element 4. The first material layer 41 has a first surface 411 and a second surface 412 that are opposite to each other. The second material layer 42 also has a first surface 421 and a second surface 422 that are opposite to each other. Outlines of the first surface 411, 421 and the second surface 412, 422 can have a planar shape or a jagged shape, but the present disclosure is not limited thereto.

As shown in FIG. 1 and FIG. 2, the outline of the first surface 411 and the outline of the second surface 412 of the first material layer 41 are symmetrical to each other (i.e., both have a planar shape), and the outline of the first surface 421 and the outline of the second surface 422 of the second material layer 42 are symmetrical to each other (i.e., both have a planar shape). Furthermore, an inner surface 4S of the adhesive element 4 is formed by the first surface 411 of the first material layer 41 and the first surface 421 of the second material layer 42, and an outer surface of the adhesive element 4 is formed by the second surface 412 of the first material layer 41 and the second surface 422 of the second material layer 42. Therefore, the inner surface 4S and the outer surface of the adhesive element 4 are symmetrical to each other (since only the inner surface 4S can be seen from FIG. 2, the outer surface is not marked with a reference sign).

As shown in FIG. 1 and FIG. 3, the outlines of the first surface 411 and the second surface 412 of the first material layer 41 are asymmetric (i.e., the outline of the first surface 411 has a jagged shape, and the outline of the second surface 412 has a planar shape). The outlines of the first surface 421 and the second surface 422 of the second material layer 42 are asymmetric (i.e., the outline of the first surface 421 has a jagged shape, and the outline of the second surface 422 has a planar shape). Therefore, the inner surface 4S and the outer surface of the adhesive element 4 are asymmetric to each other.

Second Embodiment

Figure 4:
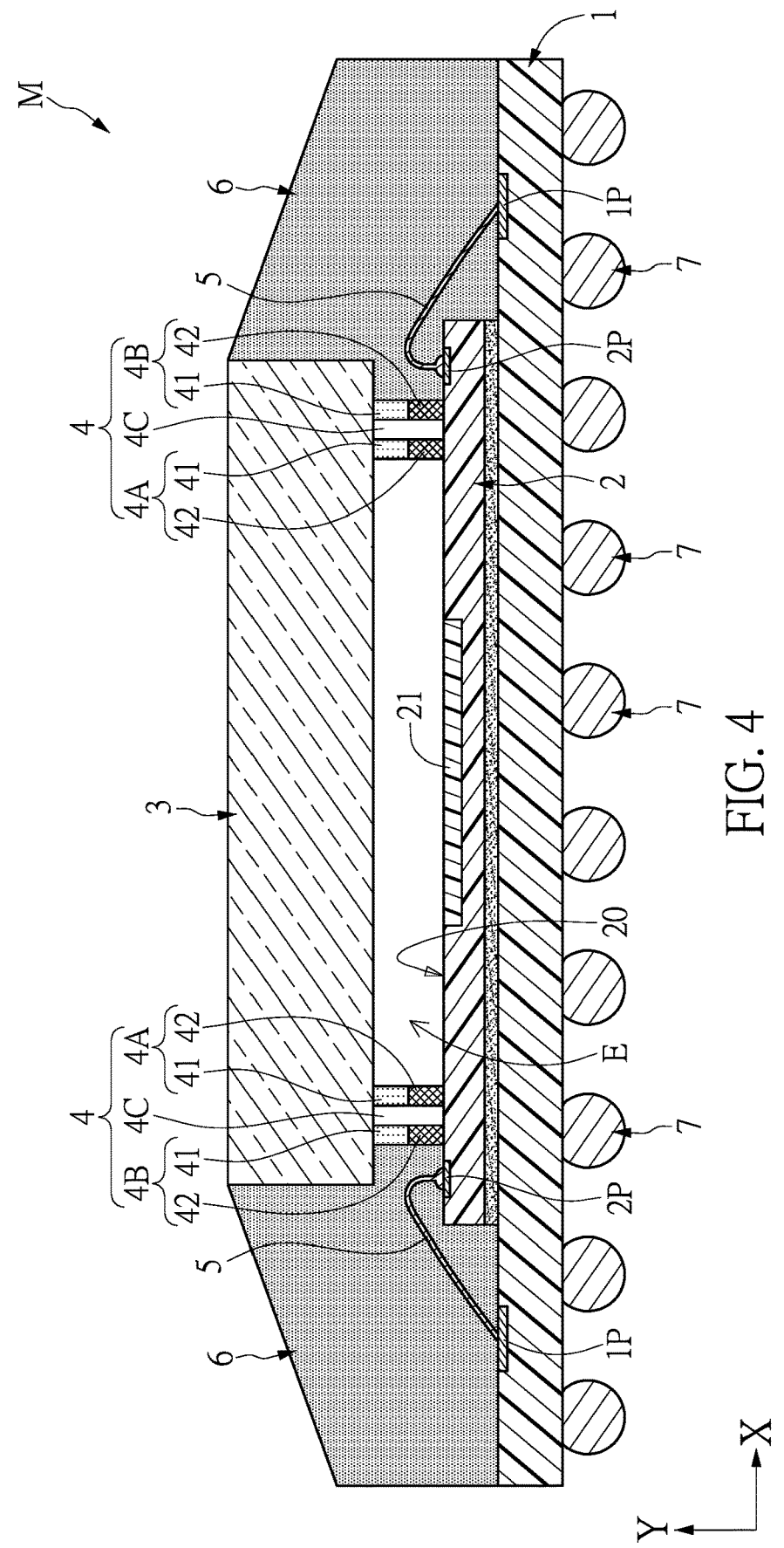
FIG. 4 is a schematic cross-sectional view of a chip package structure according to a second embodiment of the present disclosure.
Figure 5:
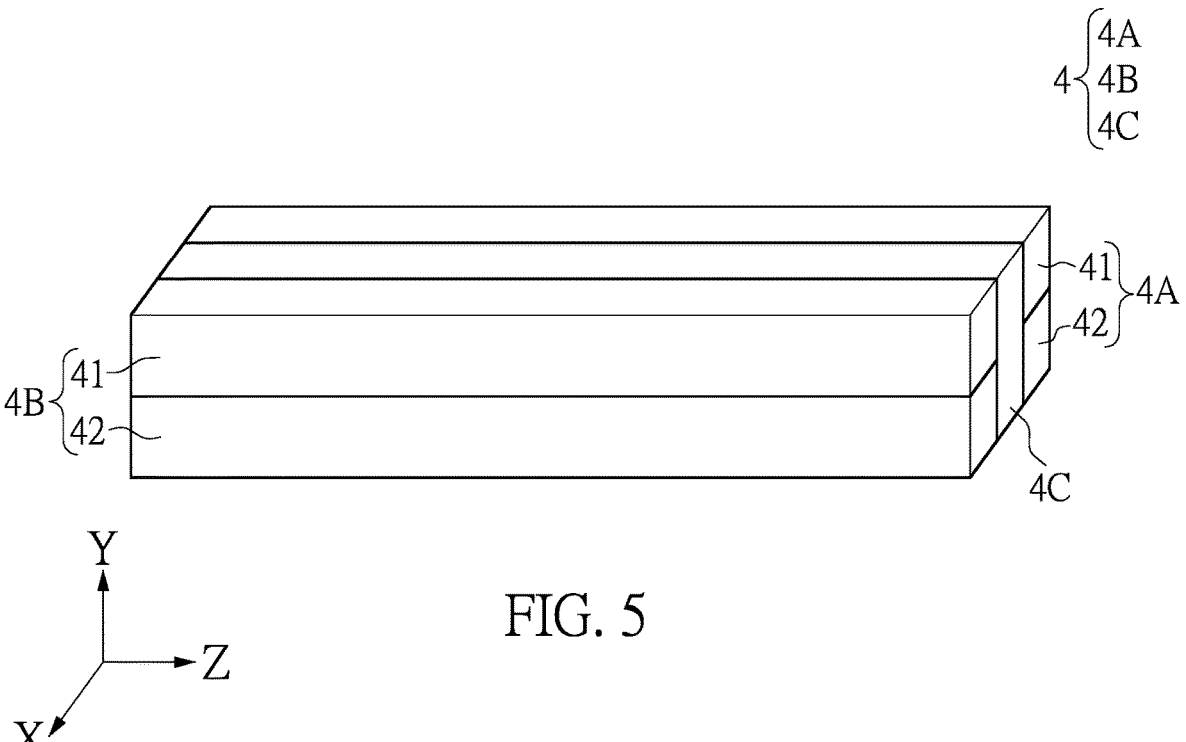
FIG. 5 is a schematic view of an adhesive element according to the second embodiment of the present disclosure.

Referring to FIG. 4 and FIG. 5, FIG. 4 is a schematic cross-sectional view of a chip package structure according to a second embodiment of the present disclosure, and FIG. 5 is a schematic view of an adhesive element according to the second embodiment of the present disclosure. A second embodiment of the present disclosure provides a chip package structure M, which includes a substrate 1, a chip 2, a light-permeable element 3, an adhesive element 4, a plurality of metal wires 5, and an encapsulation compound 6. The chip package structure M of the second embodiment has a structure similar to that of the chip package structure M of the first embodiment, and the similarities therebetween will not be reiterated herein. The main difference between the second embodiment and the first embodiment is that the adhesive element 4 of the second embodiment can be divided into an inner part and an outer part by having a medium filled therein.

Specifically, the adhesive element 4 includes an inner adhesive portion 4A, an outer adhesive portion 4B, and a middle portion 4C. Each of the inner adhesive portion 4A and the outer adhesive portion 4B includes a part of the first material layer 41 and a part of the second material layer 42. The middle portion 4C is disposed between the inner adhesive portion 4A and the outer adhesive portion 4B, and completely separates the inner adhesive portion 4A and the outer adhesive portion 4B. In other words, the inner adhesive portion 4A and the outer adhesive portion 4B are separated from and not in contact with each other. It is worth mentioning that the material of the middle portion 4C filled between the first material layer 41 and the second material layer 42 is different from that of the first material layer 41 and the second material layer 42. For example, the medium of the present embodiment is air. That is, the middle portion 4C is an air gap layer. However, the present disclosure is not limited thereto. In addition, the size of each of the inner adhesive portion 4A, the outer adhesive portion 4B, and the middle portion 4C is not limited in the present disclosure.

When the outer adhesive portion 4B deteriorates due to the adhesive element 4 being subject to an external stress, the middle portion 4C can protect the inner adhesive portion 4A from being affected by the external stress. Therefore, the influence of the external stress on the adhesive element 4 can be reduced through the structural design of the middle portion 4C, and the reliability and structural strength of the adhesive element 4 can be improved. In addition, when light (i.e., stray light) is incident to the adhesive element 4, one part of the light is reflected, and another part of the light passes through the adhesive element 4. Through the feature of a refractive index of the middle portion 4C being different from that of the inner adhesive portion 4A and the outer adhesive portion 4B, a path of the light passing through the adhesive element 4 can be changed, thereby reducing the probability of incidence into the image sensing region 21.

As shown in FIG. 4, since the middle portion 4C completely separates the inner adhesive portion 4A from the outer adhesive portion 4B, the inner adhesive portion 4A is located inside the accommodating space E, and the outer adhesive portion 4B is located outside the accommodating space E. When the adhesive element 4 is subject to the external stress, the outer adhesive portion 4B is affected most, and the inner adhesive portion 4A can maintain a sufficient structural strength.

Third Embodiment

Figure 6:
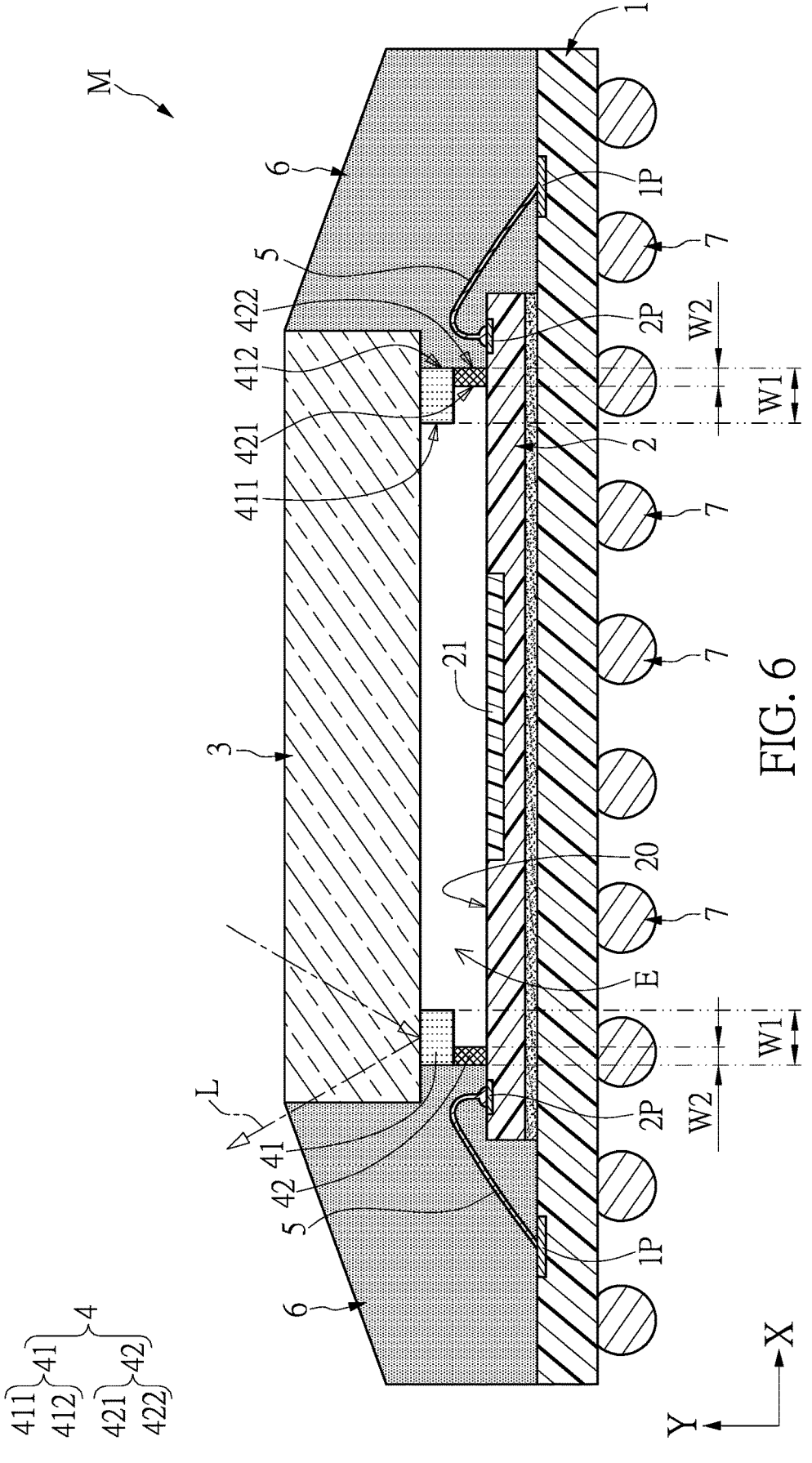
FIG. 6 is a schematic cross-sectional view of one configuration of a chip package structure according to a third embodiment of the present disclosure.
Figure 7:
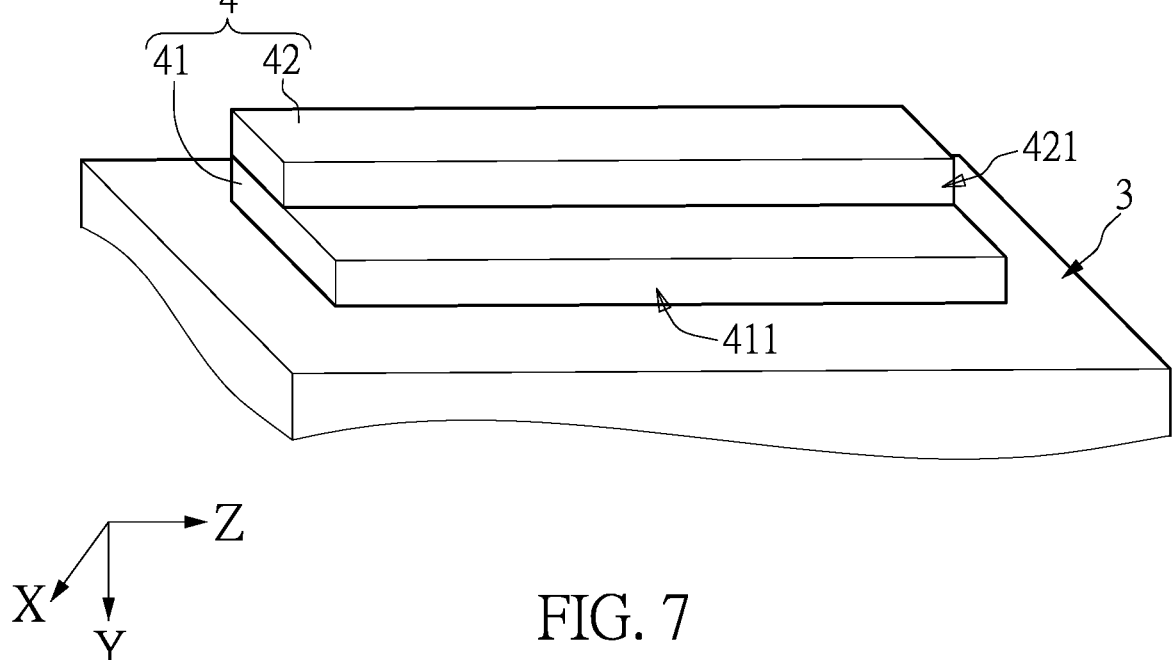
FIG. 7 is a schematic view of one configuration of an adhesive element according to the third embodiment of the present disclosure.
Figure 8:
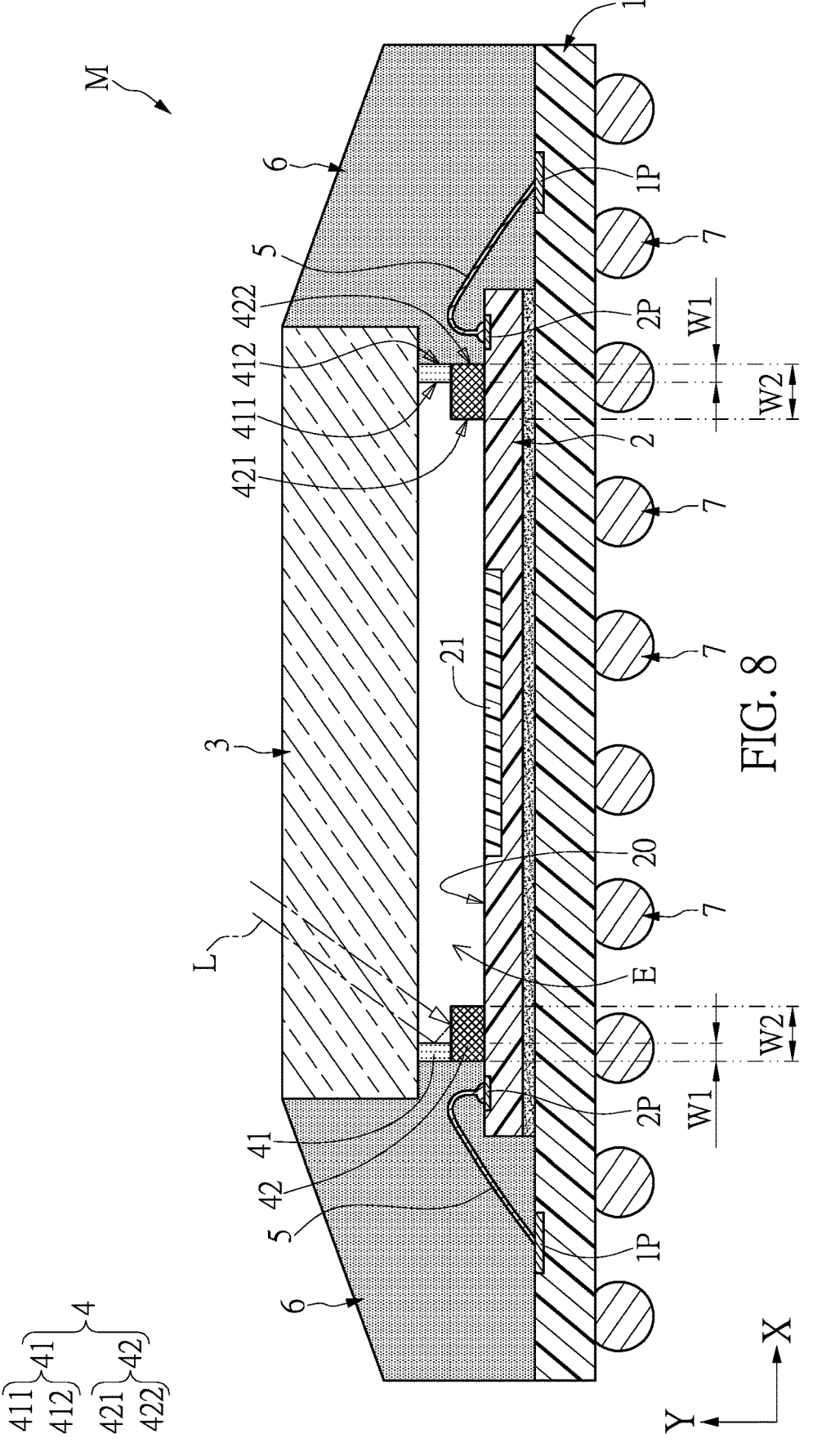
FIG. 8 is a schematic cross-sectional view of another configuration of the chip package structure according to the third embodiment of the present disclosure.
Figure 9:
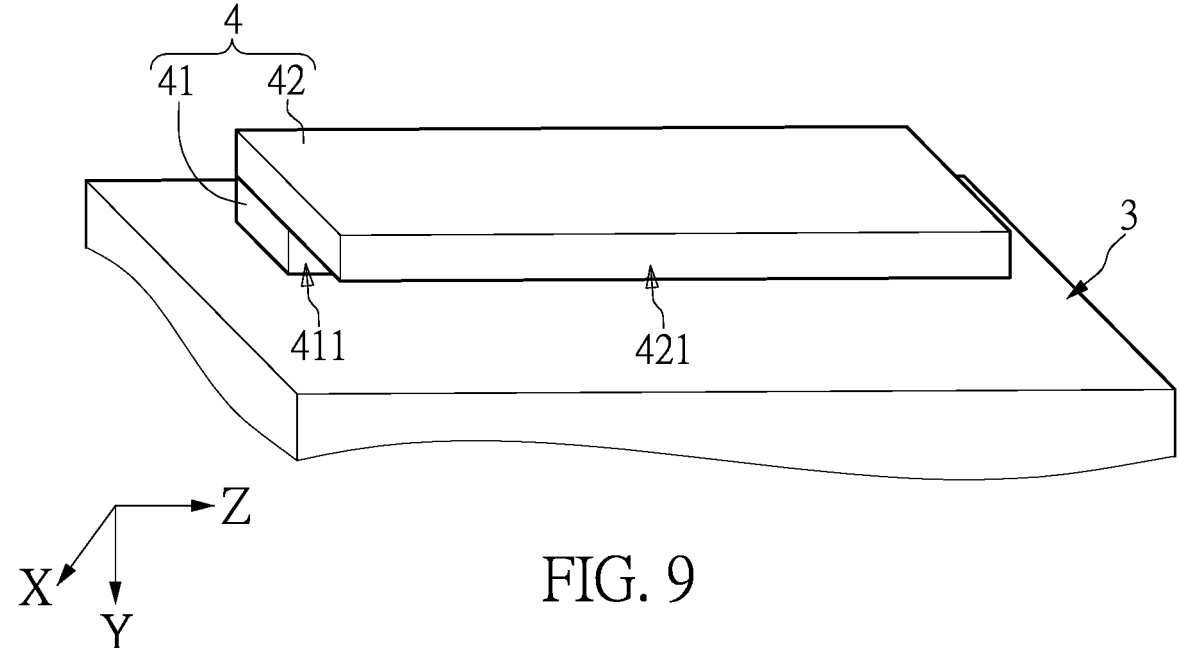
FIG. 9 is a schematic view of another configuration of the adhesive element according to the third embodiment of the present disclosure.

Referring to FIG. 6 to FIG. 9, FIG. 6 and FIG. 8 are schematic cross-sectional views of different configurations of a chip package structure according to a third embodiment of the present disclosure, and FIG. 7 and FIG. 9 are schematic views of different configurations of an adhesive element according to the third embodiment of the present disclosure. A third embodiment of the present disclosure provides a chip package structure M, which includes a substrate 1, a chip 2, a light-permeable element 3, an adhesive element 4, a plurality of metal wires 5, and an encapsulation compound 6. The chip package structure M of the third embodiment has a structure similar to that of the chip package structure M of the first embodiment, and the similarities therebetween will not be reiterated herein. The main difference between the third embodiment and the first embodiment is that widths of the first material layer 41 and the second material layer 42 are not equal to each other in the third embodiment. Furthermore, a projection area of the first material layer 41 projected onto the light-permeable element 3 is not equal to a projection area of the second material layer 42 projected onto the light-permeable element 3.

As shown in FIG. 6 and FIG. 7, the first surface 411 and the second surface 412 of the first material layer 41 have a first width W1 therebetween, and the first width W1 is a width of the first material layer 41. The first surface 421 and the second surface 422 of the second material layer 42 have a second width W2 therebetween, and the second width W2 is a width of the second material layer 42. In the third embodiment, the first width W1 is not equal to the second width W2. Specifically, the first width W1 is greater than the second width W2. When the first width W1 is greater than the second width W2, the projection area of the first material layer 41 projected onto the light-permeable element 3 is greater than the projection area of the second material layer 42 projected onto the light-permeable element 3. When the visible light passes through the light-permeable element 3 and is incident into the accommodating space E, one part of stray light L is absorbed by the first material layer 41, and another part of the stray light L is directly reflected by the first material layer 41 and cannot enter the accommodating space E, thereby reducing the probability of the stray light L being received by the image sensing region 21.

On the other hand, as shown in FIG. 8 and FIG. 9, the first width W1 can be, for example, smaller than the second width W2. Thus, the projection area of the first material layer 41 projected onto the light-permeable element 3 is smaller than the projection area of the second material layer 42 projected onto the light-permeable element 3. When the visible light passes through the light-permeable element 3 and is incident into the accommodating space E, one part of the stray light L is sequentially absorbed by the second material layer 42 and the first material layer 41, and another part of the stray light L is sequentially reflected by the second material layer 42 and the first material layer 41, thereby keeping the stray light L away from the image sensing region 21.

Therefore, by adjusting the structure and the size of each of the first material layer 41 and the second material layer 42, the light (i.e., the stray light L) is reflected away from the image sensing region 21, thereby reducing the probability of the stray light L being received by the image sensing region 21.

Beneficial Effects of the Embodiments

In conclusion, in the chip package structure M provided by the present disclosure, through the feature of the adhesive element 4 being a composite structure that includes two material layers and the optical property of the two material layers having complementary visible light absorption spectra, the adhesive element 4 can be used to absorb the full visible spectrum light. Accordingly, the adhesive element 4 can directly absorb the stray light that is incident into the chip package structure M, so as to reduce the probability of reflection to the image sensing region 21 and improve the image quality.

Furthermore, the influence of the external stress on the adhesive element 4 can be reduced through the structural design of the middle portion 4C, and the reliability and structural strength of the adhesive element 4 can be improved. When the outer adhesive portion 4B deteriorates due to the adhesive element 4 being subject to the external stress, the middle portion 4C can protect the inner adhesive portion 4A from being affected by the external stress. In addition, through the feature of the refractive index of the middle portion 4C being different from that of the inner adhesive portion 4A and the outer adhesive portion 4B, a path of the stray light L passing through the adhesive element 4 can be changed, thereby reducing the probability of incidence into the image sensing region 21.

Furthermore, by adjusting the structure and the size of each of the first material layer 41 and the second material layer 42, the stray light L is reflected away from the image sensing region 21, thereby reducing the probability of the stray light L being received by the image sensing region 21.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip package structure, comprising:
a substrate;
a chip disposed on the substrate;
a light-permeable element disposed above the chip; and
an adhesive element connected between the chip and the light-permeable element, wherein the adhesive element surrounds the chip for formation of an accommodating space, and the chip is located at the accommodating space; wherein the adhesive element includes two material layers having complementary visible light absorption spectra, such that the adhesive element is capable of being used to absorb full visible spectrum light.

2. The chip package structure according to claim 1, wherein the two material layers includes a first material layer and a second material layer, each of the first material layer and the second material layer has a first surface and a second surface opposite to each other, and an outline of the first surface and an outline of the second surface are symmetrical to each other.

3. The chip package structure according to claim 1, wherein the two material layers includes a first material layer and a second material layer, each of the first material layer and the second material layer has a first surface and a second surface opposite to each other, and an outline of the first surface and an outline of the second surface are asymmetric to each other.

4. The chip package structure according to claim 1, wherein the two material layers includes a first material layer and a second material layer, each of the first material layer and the second material layer has a first surface and a second surface opposite to each other, the first surface and the second surface of the first material layer have a first width therebetween, the first surface and the second surface of the second material layer have a second width therebetween, and the first width is not equal to the second width.

5. The chip package structure according to claim 4, wherein a projection area of the first material layer projected onto the light-permeable element is not equal to a projection area of the second material layer projected onto the light-permeable element.

6. The chip package structure according to claim 1, wherein the adhesive element includes an inner adhesive portion, an outer adhesive portion, and a middle portion, each of the inner adhesive portion and the outer adhesive portion includes a part of the first material layer and a part of the second material layer, and the middle portion is disposed between the inner adhesive portion and the outer adhesive portion and completely separates the inner adhesive portion and the outer adhesive portion.

7. The chip package structure according to claim 6, wherein the middle portion is used to be filled with a medium that is different from the first material layer and the second material layer.

8. The chip package structure according to claim 7, wherein the medium is air.

9. The chip package structure according to claim 1, further comprising a plurality of metal wires electrically connected between the chip and the substrate.

10. The chip package structure according to claim 9, further comprising an encapsulation compound disposed on the substrate, wherein the chip, the adhesive element, the plurality of metal wires, and a part of the light-permeable element are embedded within the encapsulation compound.

* * * * *